US010200036B1

(12) United States Patent
Ward et al.

(10) Patent No.: US 10,200,036 B1
(45) Date of Patent: Feb. 5, 2019

(54) RADIATION-HARD PRECISION VOLTAGE REFERENCE

(71) Applicant: THE CHARLES STARK DRAPER LABORATORY, INC., Cambridge, MA (US)

(72) Inventors: Paul A. Ward, Dedham, MA (US); James S. Pringle, Newton, MA (US); Marc S. Weinberg, Needham, MA (US); Warner G. Harrison, Medfield, MA (US)

(73) Assignee: THE CHARLES STARK DRAPER LABORATORY, INC., Cambridge, MA (US)

( * ) Notice: Subject to any disclaimer, the term of this patent is extended or adjusted under 35 U.S.C. 154(b) by 213 days.

(21) Appl. No.: 15/175,884

(22) Filed: Jun. 7, 2016

Related U.S. Application Data

(60) Provisional application No. 62/186,900, filed on Jun. 30, 2015.

(51) Int. Cl.
  *H03K 19/003* (2006.01)
  *H03B 5/32* (2006.01)
  (Continued)

(52) U.S. Cl.
  CPC .......... *H03K 19/0033* (2013.01); *H03B 5/32* (2013.01); *H03H 9/02259* (2013.01);
  (Continued)

(58) Field of Classification Search
  CPC ... H03L 7/00; H03L 7/099; H03L 1/02; H01L 29/7869; H01L 27/1225; H01L 27/1255;
  (Continued)

(56) References Cited

U.S. PATENT DOCUMENTS

| 4,891,611 A | 1/1990 | Frerking |
| 5,783,973 A * | 7/1998 | Weinberg ............. G01C 19/574 |
| | | 331/116 M |

(Continued)

OTHER PUBLICATIONS

Wibbeler et al., "Parasitic charging of dieletric surfaces in capacitive microelectromechanical systems (MEMS)", Sensors and Actuators, A71, 1998, 74-80.

(Continued)

*Primary Examiner* — Arnold Kinkead
(74) *Attorney, Agent, or Firm* — Lando & Anastasi, LLP

(57) ABSTRACT

Provided is a Precision Voltage Reference (PVR). In one example, the PVR includes a resonator having an oscillation frequency, the resonator including a first proof-mass, a first forcer located adjacent a first side of the first proof-mass, and a second forcer located adjacent a second side of the first proof-mass. The PVR may include control circuitry configured to generate a reference voltage based on the oscillation frequency of the resonator, at least one converter configured to receive the reference voltage from the control circuitry, provide a first bias voltage to the first forcer based on the reference voltage, provide a second bias voltage to the second forcer based on the reference voltage, and periodically alter a polarity of the first and second bias voltages to drive the oscillation frequency to match a reference frequency, and an output configured to provide the reference voltage as a voltage reference signal.

16 Claims, 10 Drawing Sheets

(51) Int. Cl.
*H03H 9/02* (2006.01)
*H03H 9/24* (2006.01)
*H03L 7/099* (2006.01)
*H03L 1/02* (2006.01)

(52) U.S. Cl.
CPC ...... *H03H 9/02448* (2013.01); *H03H 9/2405* (2013.01); *H03L 1/02* (2013.01); *H03L 7/099* (2013.01); *H03B 2201/031* (2013.01)

(58) Field of Classification Search
CPC .......... H01L 27/124; H01L 2924/0002; H03K 19/0033; H03B 5/32; H03B 2201/031; H03H 9/02259; H03H 9/2405; H03H 9/02448
USPC ................................ 331/116 M, 154, 107 A
See application file for complete search history.

(56) References Cited

U.S. PATENT DOCUMENTS

| | | | |
|---|---|---|---|
| 8,183,946 B2 | 5/2012 | Steeneken et al. | |
| 9,224,435 B2 | 12/2015 | Ward et al. | |
| 2008/0315962 A1 | 12/2008 | Anderson et al. | |
| 2010/0013501 A1* | 1/2010 | Van Den Boom | G01D 3/08 324/679 |

OTHER PUBLICATIONS

Schwartz, George, N., "A Novel Precision Voltage Reference Using a Micromechanical Resonator," B.S. Applied Physics, US Air Force Academy, 1996, Submitted to the Department of Electrical Engineering and Computer Science in Partial Fulfillment of the Reqirements for the Degree of Master of Science in Electrical Engeering at the Massachusetts Institute of Technology, Jun. 1998, 131 pages.

* cited by examiner

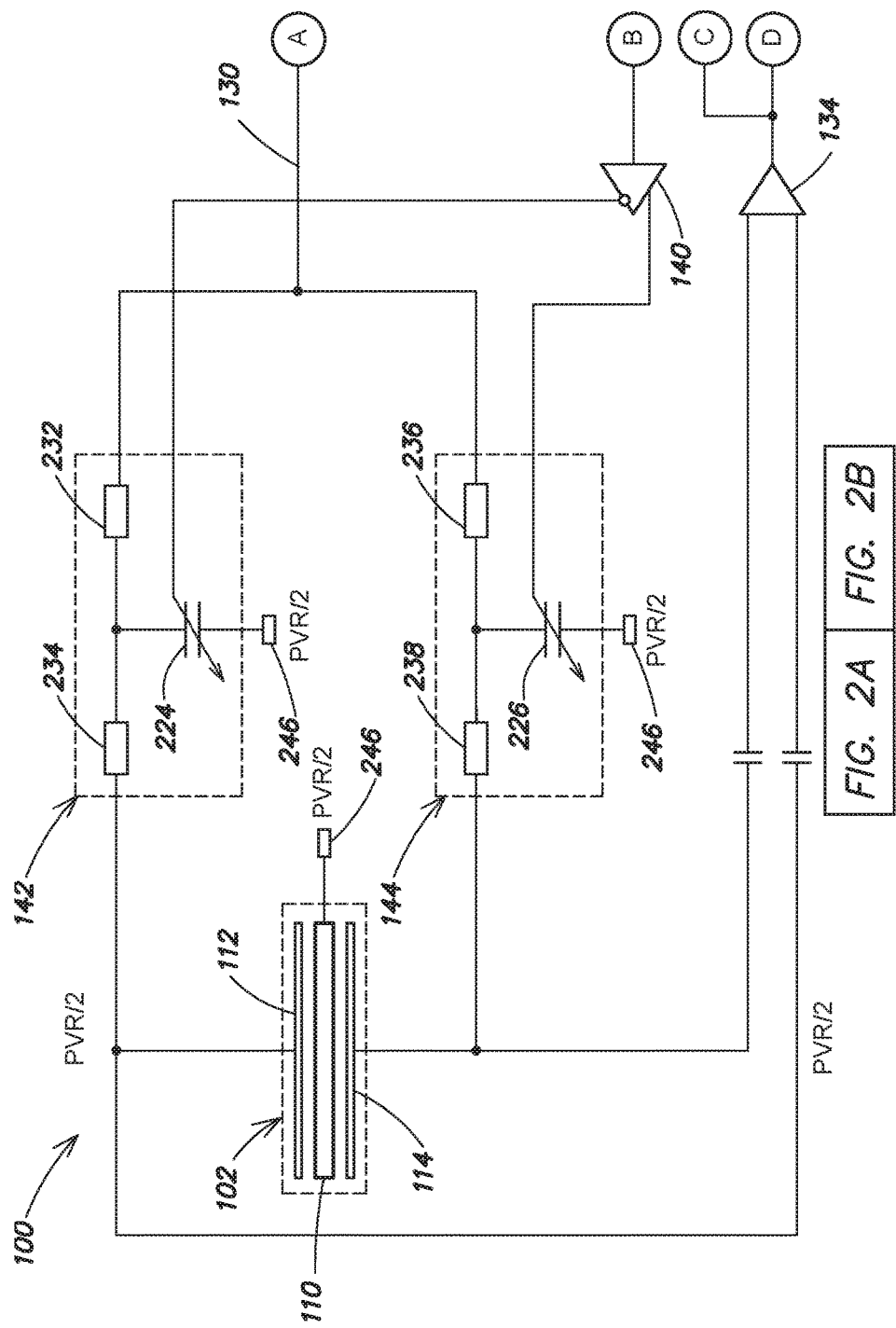

RADIATION-HARD PRECISION VOLTAGE REFERENCE

CROSS-REFERENCE TO RELATED APPLICATIONS

This application claims priority under 35 U.S.C. § 119(e) to U.S. Provisional Application Ser. No. 62/186,900, titled "RADIATION-HARD PRECISION VOLTAGE REFERENCE," filed on Jun. 30, 2015, which is hereby incorporated herein by reference in its entirety.

BACKGROUND

The lack of availability of an ultra high precision radiation-hard Precision Voltage Reference (PVR) has influenced the development of technology options for high performance inertial instruments over the past several decades. Accordingly, there have been a number of different techniques pursued with the goal of developing such a radiation-hard PVR (RHPVR). Some of the ideas pursued include the exploitation of: the negative resistance of a tunnel diode, nuclear magnetic resonance, electron-spin resonance, a compensated semiconductor avalanche diode, and the rebalancing of a pendulum against a permanent magnet. Unfortunately, no technique to date has resulted in a device or circuit having suitable performance.

SUMMARY OF THE INVENTION

Aspects and embodiments are directed to a Precision Voltage Reference (PVR) based on the mechanical properties of a MEMS (Micro-Electro-Mechanical System) resonator, which are inherently radiation-hard. As used herein, "radiation" refers to ionizing radiation, such as radiation experienced in high-altitude flight and outer space. The MEMS based Radiation-Hard Precision Voltage Reference (RHPVR) can attain greatly improved radiation hardness compared to current state-of-the-art radiation-hard voltage references, which are typically based solely on radiation sensitive electrical components such as diodes and/or transistors. In various aspects, a converter receives a reference voltage based on an oscillation frequency of the MEMS resonator and provides a bias voltage to the resonator based on the reference voltage. Periodic transitions of the polarity of the bias voltage drive the resonator at the oscillation frequency. By applying the bias voltage to the MEMS resonator such that the oscillation frequency of the MEMS resonator matches a stable reference frequency, the reference voltage can be stabilized, and an RHPVR may be produced.

According to further aspects, the RHPVR may also achieve high stability in nuclear radiation environments, such as stability approaching 1 ppm. Various embodiments of the RHPVR discussed herein periodically alter the polarity of the applied bias voltage, desensitizing the RHPVR to trapped charge. Such aspects and embodiments permit highly-reliable thrust-axis accelerometers capable of supporting the stringent performance requirements of strategic guidance applications. Accordingly, various embodiments address the effects of radiation induced trapped charge and DC offset voltages, such as from unbalanced thermocouple voltages, which may directly impact the RHPVR.

According to certain aspects and embodiments discussed herein, provided is a PVR. In one example, the PVR includes a resonator having an oscillation frequency, the resonator including a first proof-mass, a first forcer located adjacent a first side of the first proof-mass, and a second forcer located adjacent a second side of the first proof-mass, control circuitry configured to generate a reference voltage based on the oscillation frequency of the resonator, at least one converter coupled to the control circuitry, the first forcer, and the second forcer, the at least one converter configured to receive the reference voltage from the control circuitry, provide a first bias voltage to the first forcer based on the reference voltage, provide a second bias voltage to the second forcer based on the reference voltage, and periodically alter a polarity of the first bias voltage and the second bias voltage to drive the oscillation frequency of the resonator to match a reference frequency, and an output configured to provide the reference voltage as a voltage reference signal.

According to an example, in periodically altering the polarity of the first bias voltage and the second bias voltage, the at least one converter is further configured to drive the first bias voltage and the second bias voltage between the reference voltage and a ground reference. In one example, the PVR further includes a voltage reference coupled to the proof-mass and configured to reference the proof-mass to substantially one half of the reference voltage.

In one example, the control circuitry includes a frequency module coupled to the at least one converter, and the frequency module includes a frequency detector configured to detect the oscillation frequency of the resonator, a frequency comparator configured to compare a time-average of the oscillation frequency to the reference frequency, and a frequency controller configured to generate a force adjustment signal based on the compared oscillation frequency and reference frequency to adjust the reference voltage generated by the control circuitry such that the oscillation frequency of the resonator matches the reference frequency.

According to one example, the control circuitry includes an amplitude module coupled to the first forcer and the second forcer, and the amplitude module includes an amplitude detector configured to detect an oscillation amplitude of resonator oscillations, an amplitude comparator configured to compare the oscillation amplitude to an amplitude reference, and an amplitude controller configured to generate an amplitude adjustment signal based on the compared oscillation amplitude and amplitude reference. In a further example, the PVR further includes a first tunable capacitor coupled to the first forcer, a second tunable capacitor coupled to the second forcer, and an amplifier coupled to the first tunable capacitor, the second tunable capacitor, and the amplitude module, and the amplitude adjustment signal controls the amplifier to adjust a differential delay between the first bias voltage provided to the first forcer and the second bias voltage provided to the second forcer.

According to an example, the PVR further includes a bias control circuit coupled to the amplitude module, and the at least one converter includes a first converter coupled to the bias control circuit and the first forcer, and configured to provide the first bias voltage to the first forcer, and the at least one converter includes a second converter coupled to the bias control circuit and the second forcer, and configured to provide the second bias voltage to the second forcer, and the amplitude adjustment signal controls the bias control circuit to adjust a differential delay between the first bias voltage provided to the first forcer and the second bias voltage provided to the second forcer.

In one example, the at least one converter includes a one-bit digital-analog converter. According to an example, the resonator further includes a second proof-mass, a third forcer located adjacent a first side of the second proof-mass, and a fourth forcer located adjacent a second side of the second proof-mass, and the at least one converter is configured to apply at least one of the first bias voltage and the second bias voltage to at least one of the third forcer and the fourth forcer.

According to certain other aspects and embodiments, provided is another PVR. According to one example, the PVR includes a resonator having an oscillation frequency, the resonator including a first proof-mass, a first forcer located adjacent a first side of the first proof-mass, and a second forcer located adjacent a second side of the first proof-mass, control circuitry configured to generate a reference voltage based on the oscillation frequency of the resonator, conversion means coupled to the first forcer and the second forcer and configured to receive the reference voltage from the control circuitry, provide a first bias voltage to the first forcer based on the reference voltage, provide a second bias voltage to the second forcer based on the reference voltage, and periodically alter a polarity of the first bias voltage and the second bias voltage such that the oscillation frequency of the resonator matches a reference frequency, and an output configured to provide the reference voltage as a voltage reference signal.

According to certain aspects and embodiments, provided is a method for generating a precision voltage reference with a resonator having an oscillation frequency, the resonator including a first proof-mass, a first forcer located adjacent a first side of the first proof-mass, and a second forcer located adjacent a second side of the first proof-mass. In one example, the method includes receiving a reference voltage with at least one converter coupled to the first forcer and the second forcer, providing, with the at least one converter, a first bias voltage based on the reference voltage to the first forcer, providing, with the at least one converter, a second bias voltage based on the reference voltage to the second forcer, periodically altering a polarity of the first bias voltage applied to the first forcer and the second bias voltage applied to second forcer such that the oscillation frequency of the resonator matches a reference frequency, and providing the reference voltage as a voltage reference signal.

In one example, the method further includes generating the reference voltage based on an oscillation frequency of the resonator. In an example, periodically altering the polarity of the first bias voltage and the second bias voltage includes driving the first bias voltage and the second bias voltage between the reference voltage and a ground reference. According to an example, the method further includes referencing the first proof-mass to substantially one half of the reference voltage.

According to one example, the method further includes detecting the oscillation frequency of the resonator, comparing a time-average of the oscillation frequency of the resonator to the reference frequency, and generating a force adjustment signal responsive to comparing the oscillation frequency of the resonator and the reference frequency, and adjusting, based on the force adjustment signal, the reference voltage such that the oscillation frequency of the resonator matches the reference frequency.

In one example, the method further includes detecting an oscillation amplitude of resonator oscillations, comparing the oscillation amplitude to an amplitude reference, and generating an amplitude adjustment signal responsive to comparing the oscillation amplitude and the amplitude reference. In a further example, the method further includes providing the amplitude adjustment signal to an amplifier, the amplifier coupled to a first tunable capacitor and a second tunable capacitor, and controlling the first tunable capacitor and the second tunable capacitor based on the amplitude adjustment signal to adjust a differential delay between the first bias voltage applied to the first forcer and the second bias voltage applied to the second forcer.

According to an example, the at least one converter includes a first converter coupled to the first forcer and configured to provide the first bias voltage, and a second converter coupled to the second forcer and configured to provide the second bias voltage, and the method further includes providing the amplitude adjustment signal to a bias control circuit, and controlling the bias control circuit based on the amplitude adjustment signal to adjust a differential delay between the first bias voltage applied to the first forcer and the second bias voltage applied to the second forcer. In one example, the resonator includes a second proof-mass, a third forcer located adjacent a first side of the second proof-mass, and a fourth forcer located adjacent a second side of the second proof-mass, and the method further includes applying at least one of the first bias voltage and the second bias voltage to at least one of the third forcer and the fourth forcer.

Various aspects, embodiments, and implementations discussed herein may include means for performing any of the recited features or functions.

Still other aspects, embodiments, and advantages of these exemplary aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. Any embodiment disclosed herein may be combined with any other embodiment in any manner consistent with at least one of the objectives, aims, and needs disclosed herein, and references to "an embodiment," "some embodiments," "an alternate embodiment," "various embodiments," "one embodiment" or the like are not necessarily mutually exclusive and are intended to indicate that a particular feature, structure, or characteristic described in connection with the embodiment may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIGS. 2A-2B is a more detailed block diagram of the example RHPVR shown in FIG. 1 according to aspects of the invention;

DETAILED DESCRIPTION

Figure 1:
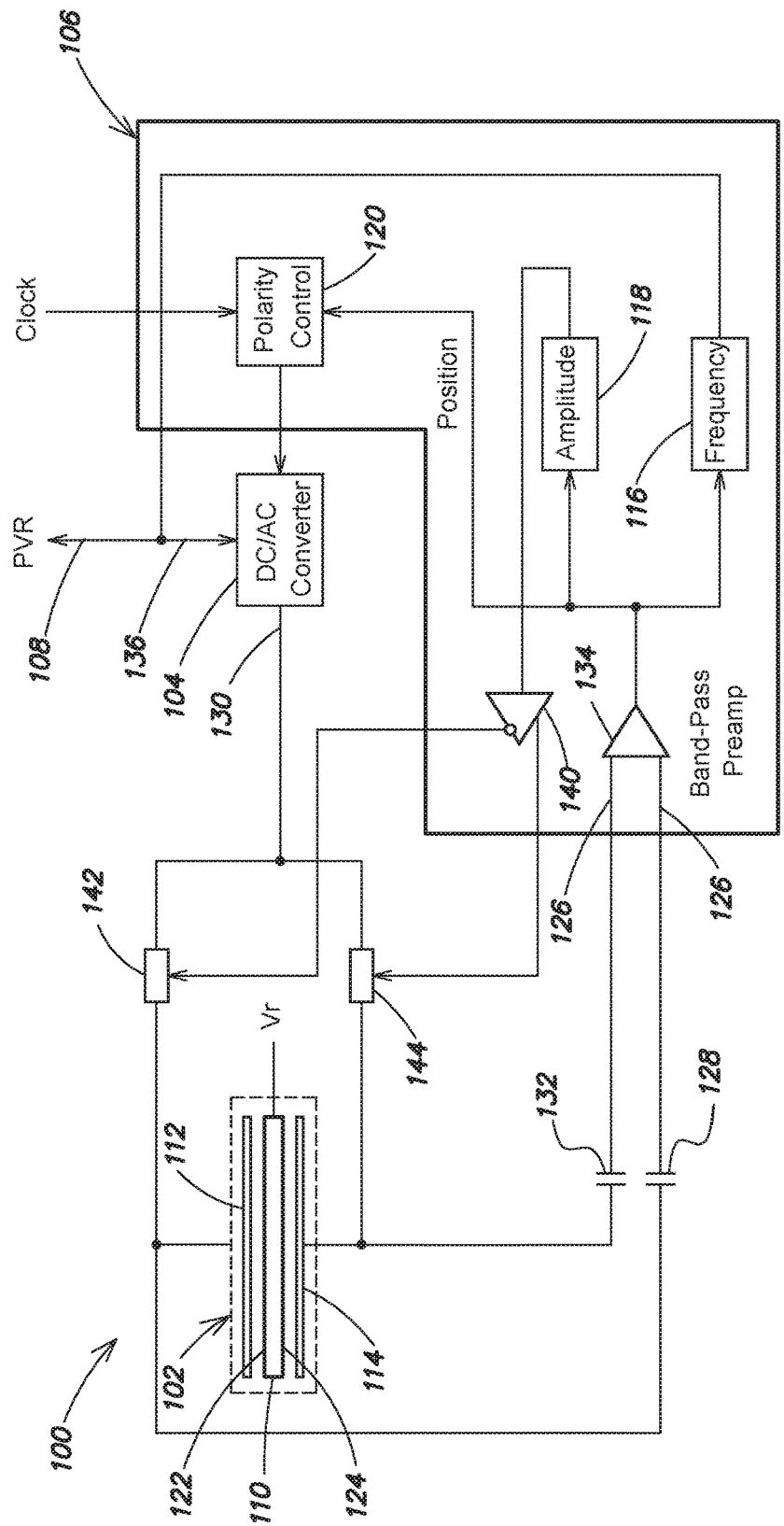
FIG. 1 is a block diagram of one example of a RHPVR according to aspects of the invention.

Current state-of-the-art solid state voltage references are typically based on diodes and/or transistors. The properties of these devices affecting voltage stability have shown to be extremely difficult to make insensitive to radiation. As such, current state-of-the-art solid state voltage references typically fail to provide a radiation-hard voltage reference with the stability required for direct use in high performance inertial instruments. Accordingly, aspects and embodiments are directed to an RHPVR which provides state-of-the-art level voltage stability performance simultaneously with radiation hardness.

The RHPVR is enabled by the use of an inherently radiation-hard MEMS resonator, whose oscillation frequency can be tuned over a large frequency range by the application of a bias voltage to the resonator. The MEMS resonator includes a proof-mass that is tethered to a mechanical reference (i.e., mechanical ground) with mechanical supports, and includes one or more forcers in electrostatic communication with the proof-mass (e.g., positioned above and/or below the proof-mass). Increasing the bias voltage applied to the forcers above and/or below the proof-mass of the MEMS resonator increases the electrostatic force on the proof-mass in a way that reduces the effective spring constant imposed by the mechanical supports on the proof-mass. According to one embodiment, the polarity of the bias voltage applied to the resonator is railed between a reference voltage and a ground reference. Transitions between the peak values (i.e., the reference voltage and the ground reference) of the bias voltage produce a force step to "kick" the resonator to oscillate at the resonant frequency. As such, periodic polarity transitions of the bias voltage may be used to excite the resonator.

It is appreciated that the oscillation frequency of a MEMS resonator may drop by nearly an octave with increasing the bias voltage applied to the forcer(s). Accordingly, even very small bias voltage changes applied to the forcer(s) may result in substantial changes in the resonator's oscillation frequency. Accordingly, by controlling the bias voltage applied to the forcer(s) such that the MEMS oscillation frequency matches that of an externally-supplied reference signal, a reference voltage utilized by a converter (e.g., precision digital-to-analog converter) to generate the bias voltage may also be usable as a highly stable PVR, as the reference voltage must be maintained to drive the oscillation frequency of the MEMS resonator to match the external reference signal.

While RHPVR devices generally exhibit numerous advantages over conventional radiation hard devices, electro-mechanical PVRs, in an ionizing radiation environment, are still susceptible to charging of the insulating structures that are in close proximity to the proof-mass. These charged structures can produce electrostatic forces that can act on the one or more proof-masses, thereby affecting the natural frequency of the resonator and therefore shifting the reference voltage. For example, if a Direct Current (DC) bias voltage is applied to the forcers, PVR stability may be compromised in high radiation environments as a result of the effects of a radiation induced charge. Furthermore, small offset voltages, such as from unbalanced thermocouple voltages, will directly impact the reference voltage. Accordingly, various aspects of the RHPVR discussed herein substantially eliminate the effects of trapped charge in the RHPVR, as well as error potentials in series with forcer capacitances, by periodically reversing the polarity of a bias voltage applied to the forcers of a resonator.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. FIG. 1 illustrates a functional block diagram of one example of an RHPVR 100 according to aspects described herein.

The RHPVR 100 includes a resonator 102, a converter 104, control circuitry 106, and an output 108. In the shown example, the control circuitry 106 includes a frequency module 116, an amplitude module 118, and a polarity control module 120. As shown, in one embodiment the resonator 102 includes a first proof-mass 110, a first forcer 112, and a second forcer 114. The first forcer 112 is located adjacent a first side 122 of the first proof mass 110, and the second forcer 114 is located adjacent a second side 124 of the first proof mass 110 that is opposite the first side 122. According to one embodiment, the first forcer 112 and second forcer 114 are symmetrical about the first proof mass 110 (i.e., a distance between the proof mass 110 and the first forcer 112 and a distance between the proof mass 110 and the second forcer 114 are substantially equal). However, in other embodiments, the forcers 112 and 114 may be non-symmetrical about the proof mass 110. It is also appreciated that by using a MEMS resonator within the RHPVR 100 that includes symmetrical upper and lower plates (i.e., first forcer 112 and second forcer 114), the sensitivity of the RHPVR 100 to specific-force (i.e., acceleration minus gravity) is reduced or even eliminated. While FIG. 1 shows the RHPVR as including a first forcer 112 and a second forcer 114, it is appreciated that in various embodiments, the RHPVR may include any number of forcers. Furthermore, forcers may be oriented about the proof-mass 110 in any configuration and should not be limited to the arrangements shown in any of FIGS. 1-4.

The first forcer 112 is coupled to an input terminal 126 of the control circuitry 106 via a capacitor 128. The first forcer 112 is coupled to an input terminal of the capacitor 128, and the input terminal 126 of the control circuitry 106 is coupled to an output terminal of the capacitor 128. The first forcer 112 is also coupled to an output 130 of the converter 104. Similarly, the second forcer 114 is coupled to the input terminal 126 of the control circuitry 106 via a capacitor 132. The second forcer 114 is coupled to an input terminal of the capacitor 132, and the input terminal of the control circuitry 126 is coupled to an output terminal of the capacitor 132. The second forcer 114 is also coupled to the output terminal 130 of the converter 104. An input terminal of the amplitude module 118 and an input terminal of the frequency module 116 are both coupled via a differential pick-off amplifier 134 (e.g., a band-pass preamp) to the input 126 of the control circuitry 106. The input 126 of the control circuitry 106 is coupled to an input of the differential pick-off amplifier 134, and the input terminals of the amplitude module 118 and frequency module 116 are coupled to an output terminal of the differential pick-off amplifier 134.

Generally, the control circuitry 106 couples the first forcer 112 and the second forcer 114 with the output 108 of the RHPVR 100 and an input 136 of the converter 104. In one example, the control circuitry 106 further includes a polarity control module 120 coupled between the output of the differential pick-off amplifier 134 and a second input terminal of the converter 104 and configured to receive a clock signal. The output of the amplitude module 118 is further coupled to the first forcer 112 and second forcer 114 through an amplifier 140. An output of the amplitude module 118 is coupled to an input terminal of the amplifier 140. FIG. 1 shows a first output terminal of the amplifier 140 coupled to the first forcer 112 via a first circuit element 142 and a second output terminal of the amplifier 140 coupled to the second forcer 114 via a second circuit element 144. For instance, the first circuit element 142 may couple with the first forcer 112 through a first pole, and the second circuit element 144 may couple with the second forcer 114 through a second pole. Circuit elements 142 and 144 are discussed in more detail herein with reference to FIGS. 2A-2B. While FIG. 1 illustrates an arrangement of the control circuitry 106 according to certain examples, the control circuit 106 may include other components, such as those shown in the example of FIG. 4.

Returning to FIG. 1, the first proof-mass 110 is coupled with a voltage reference. In one embodiment, the voltage reference is set equal to a value that is substantially one half of a reference voltage (PVR) generated by the control circuitry 106 and received by the converter 104 from the control circuitry 106. Each forcer 112 and 114 receives a DC bias voltage from the converter 104 based on the reference voltage. The converter 104 is configured to drive the bias voltage applied to the first and second forcers 112, 114 between a ground reference and the reference voltage received by the converter 104 from the control circuitry 106. Accordingly, the polarity of the bias voltage is periodically reversed such that the time-average bias voltage applied to the first forcer 112 and second forcer 114 is substantially zero, with respect to the proof-mass. The periodic polarity reversal is performed by the converter 104 at a rate not exceeding a natural frequency of the resonator 102. The bias voltage applied to the forcers 112, 114 generates an electrostatic force between the forcers 112, 114 and the first proof mass 110, and excites the resonator 102 at its oscillation frequency. While shown in the example of FIG. 1 as including a single converter, in various other arrangements the shown converter 104 may include a plurality of converters such as a first converter configured to deliver a bias voltage to the first forcer 112, and a second converter configured to deliver a bias voltage to the second forcer 114.

In one example, the proof-mass 110 is periodically "kicked" by the periodic transitions of the bias voltage applied to the first forcer 112 and second forcer 114. During the transition time between peak values of the bias voltage when the polarity of the bias voltage is reversed, the force acting on the proof-mass 110 is altered, displacing the position of the proof-mass 110. As discussed herein, in one embodiment a differential delay is introduced between the bias voltage applied to the first forcer 112 and the bias voltage applied to the second forcer 114. For example, the bias voltage may be applied through a filter that has a predetermined time constant, such as 25 µs. In such an example, the resulting delay between the bias voltage applied to the first forcer 112 and the bias voltage applied to the second forcer 114 may be 1 µs or 2 µs. The differential delay in time between the first forcer 112 and the second forcer 114 periodically kick the proof-mass 110 at different moments in time to prevent the "kicks" from each forcer 112, 114 canceling each other out. In another implementation, the proof mass 110 may be "kicked" by the application of a transient voltage to one forcer, for example, application of a transient voltage to the first forcer 112. Such transient voltages may be applied periodically or intermittently.

In various embodiments, the polarity control module 120 is configured to control the timing of the application of the "kick" to the proof-mass 110. For example, in one implementation, the polarity control module 120 ensures that the first forcer 112 or second forcer 114 kicks the proof-mass 110 at the same point during a position cycle of the proof-mass 110, such as at a zero-crossing of proof-mass position. The polarity control module 120 is described in further detail below with reference to FIGS. 2A-2B.

As described above, increasing the magnitude of the bias voltage applied to the forcers 112 and 114 increases the electrostatic force on the proof-mass 102 in a way that reduces the effective spring constant imposed by the mechanical supports on the proof-mass 110 and decreases the oscillation frequency of the resonator 102. Alternatively, decreasing the magnitude of the bias voltage applied to the forcers 112 and 114 decreases the electrostatic force on the proof-mass 110 in a way that increases the effective spring constant imposed by the mechanical supports on the proof-mass 110 and increases the oscillation frequency of the resonator 102. It is appreciated that by controlling the bias voltage applied to the forcers 112, 114 such that the oscillation frequency of the resonator 102 is locked to a highly-stable reference frequency, the reference voltage utilized by a converter to generate the bias voltage also becomes a very stable voltage reference, as the reference voltage must be maintained to excite the oscillation frequency of the resonator 102 to match the reference frequency. Accordingly, the reference voltage is provided at the output 108 of the RHPVR 100 as a PVR (e.g. a voltage reference signal).

The oscillation frequency (e.g., for a small oscillation amplitude) of the MEMS resonator 102 described above can be represented as:

$$\omega_n \cong \sqrt{\frac{k_1 - \frac{\partial f}{\partial y}}{m}} = \sqrt{\frac{k_1 - 2\left(\frac{\varepsilon_o A}{Y_o^3}\right)v^2}{m}}$$

where, $k_1$ is the mechanical linear stiffness of the mechanical support, $\varepsilon_o$ is the permittivity of free space, m is the mass of the proof mass 110, A is the area of the forcer (e.g., first forcer 112 and second forcer 114), and $Y_o$ is the gap for zero displacement of the proof-mass 110. Accordingly, $\overline{v}^2$ is the mean-squared value of the voltage applied to the first forcer 112 and the second forcer 114, with respect to the proof-mass 110. The oscillation frequency is a single-valued function of the applied mean-squared voltage. If the frequency is set to a particular value using a control loop, a specific mean-squared voltage will exist at the forcer 112 and second forcer 114. If the voltage applied to the forcer 112 and second forcer 114 is the reference voltage, the PVR can be represented as:

$$V_{PVR} \cong \sqrt{\frac{k_1 - m\omega_n^2}{2\left(\frac{\varepsilon_0 A}{Y_o^3}\right)}}.$$

The PVR is based on mechanical, geometric, and material constants, all of which are radiation hard. In order to periodically reverse the polarity of the bias voltage applied to the first forcer 112 and second forcer 114, the reference voltage must first be received from the control circuitry 106. In various embodiments, the PVR demonstrates a stable proportional relationship with respect to the peak-to-peak bias voltage, but is relatively insensitive to offsets in the bias voltage. The voltage applied to the first forcer 112 and second forcer 114 can be represented as:

$v(t) = V\mathrm{sq}(\omega_r t) + \delta$ where, $\mathrm{sq}(\omega_r t)$ is a unit zero-mean square-wave with radian frequency $\omega_r$, and $\delta$ is the DC offset voltage on the forcer. The mean-squared forcer voltage can then be represented as:

$\overline{v}^2 + V^2 + \delta^2 + \overline{2V\delta\mathrm{sq}(\omega_r t)} = V^2 + \delta^2.$ Accordingly, the PVR can be related to the peak-to-peak bias voltage:

$2V = G_1 \mathrm{PLR},$ which provides a PVR of:

$$PVR = \frac{2}{G_1}\sqrt{\overline{v}^2 - \delta^2}.$$

According to one embodiment, because the mean-squared forcer voltage is held approximately constant, the PVR primarily depends on $G_1$, the gain of the converter 104. As such, in various embodiments, the converter includes a converter having a stable gain configured to maintain a stable reference voltage. Additionally, periodically reversing the polarity of the bias voltage applied to the forcers 112, 114 reduces the effects of trapped charge and any voltage in series with the forcers 112, 114 to provide a system largely insensitive to offsets and trapped charge experienced by conventional RHPVRs.

Returning to FIG. 1, the oscillations of the resonator 102 are electrically sensed by measuring the displacement of the proof-mass 110. The differential pick-off amplifier 134 receives the electrically sensed oscillation based signal and provides the signal to the amplitude module 118 and the frequency module 116. The frequency module may sample the period of the oscillations, to determine the oscillation frequency, by measuring the number of system clock ticks of the clock signal between zero crossings of the proof-mass position. Similarly, the amplitude detector may sample the amplitude of oscillation by measuring the fraction of a half-period where the oscillation amplitude exceeds a predetermined threshold (e.g., amplitude threshold). In further implementations, the oscillation signal is further provided to other components of the control circuitry 106, such as the polarity control module 120 coupled to the differential pick-off amplifier 134. In one example, the differential pick-off amplifier 134 includes a bandpass preamp configured to pass the frequencies corresponding to the oscillations of the resonator 102 and attenuate the frequencies of noise within the RHPVR.

Figure 2B:
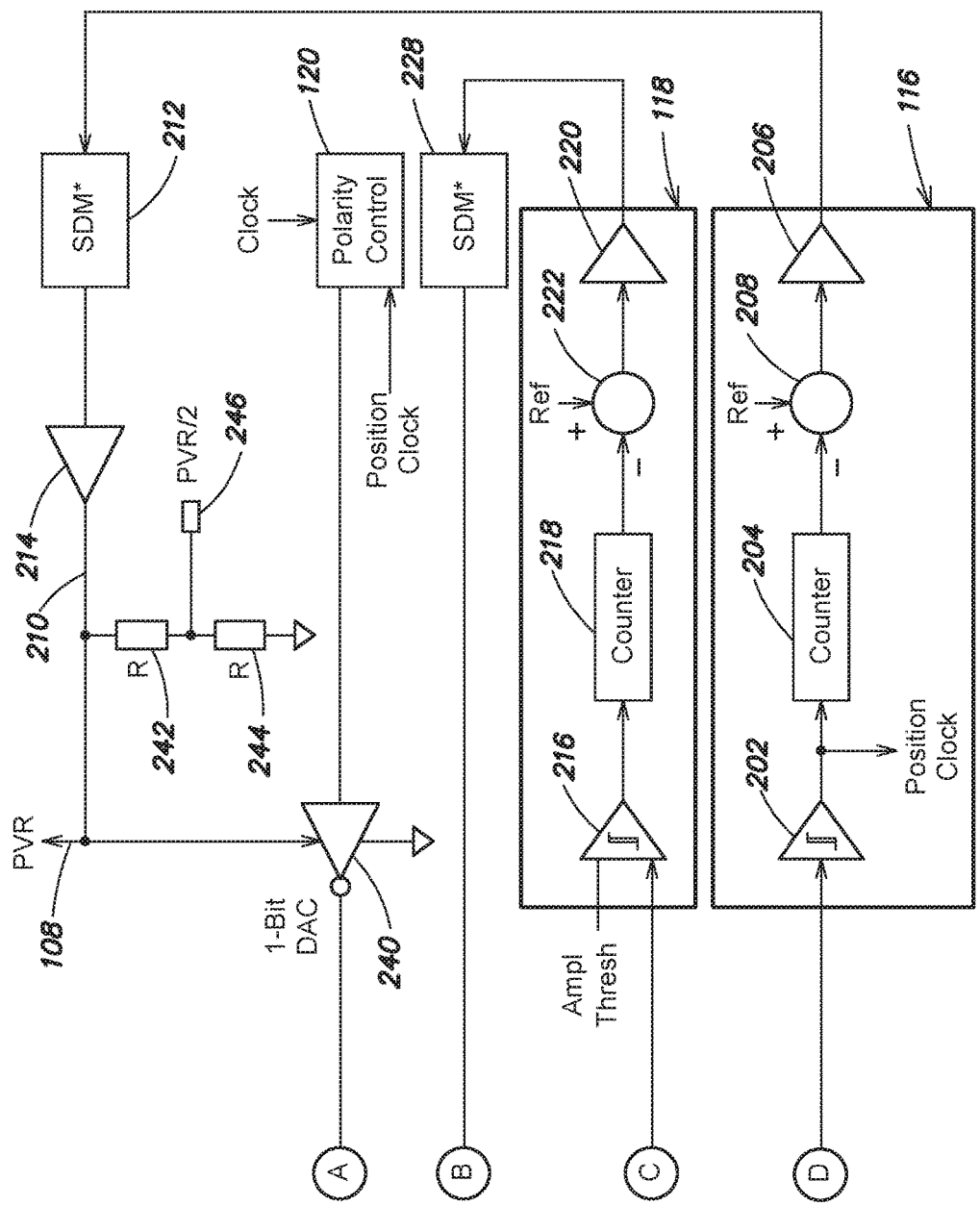

Turning to FIGS. 2A-2B, and with continuing reference to FIG. 1, shown is a more detailed diagram of the example RHPVR 100 shown in FIG. 1. In one embodiment, the frequency module 116 includes a frequency detector, a comparator, and a controller. For example, the frequency module 116 is shown in FIGS. 2A-2B including a comparator 202 coupled with the output of the differential pick-off amplifier 134, a counter 204 coupled with the comparator 202, and a controller 206 coupled with the counter 204. FIGS. 2A-2B additionally show a frequency comparator 208, at which the frequency module 116 may receive one or more reference frequency waveforms. The output of frequency module 116 is further coupled to an output of the control circuitry 210 via a digital-to-analog converter 212 (e.g., sigma delta modulator) and one or more filters 214, which may include a buffer/amplifier. An input of the digital-to-analog converter 212 is coupled to the output of the frequency module 116, an output of the digital-to-analog converter 212 is coupled to an input of the filter 214, and an output of the filter 214 is coupled to the output 210 of the control circuitry 106.

Similarly, the amplitude module 118 includes an amplitude detector, a comparator, and a controller. For example, the amplitude module 118 is shown as including a comparator 216 coupled with the output of the differential pick-off amplifier 134, a counter 218 coupled with the comparator 216, and a controller 220 coupled via an amplitude comparator 222 to the counter 218. The amplitude module 118 may receive one or more amplitude references at the amplitude comparator 222. The amplitude module 118 is further coupled to a first capacitor 224 of the first circuit element 142 and a second capacitor 226 of the second circuit element 144 via a digital-to-analog converter 228 (e.g., sigma-delta modulator) and the amplifier 140. The output of the amplitude module 118 is coupled with an input of the digital-to-analog converter 228, and an output of the digital-to-analog converter 228 is coupled with the input terminal of the amplifier 140. The first output terminal of the amplifier 140 is coupled to the first capacitor 224, and the second output terminal of the amplifier 140 is coupled to the second capacitor 226.

FIGS. 2A-2B show the first circuit element 142 including a first resistor 232 and a second resistor 234. The first capacitor 224 is further coupled to resistors 232 and 234, and a voltage reference 246, and may be arranged as a first voltage divider. The resistor 232 is further coupled with the output 130 of the converter 240, and the resistor 234 is coupled with the first forcer 112. Similarly, the second circuit element 144 is shown including a first resistor 236 and a second resistor 238. The second capacitor 226 is further coupled to the resistors 236 and 238, and voltage reference 246, and may be arranged as a second voltage divider. The resistor 236 is further coupled with the output 130 of the converter 240, and resistor 238 is coupled with the second forcer 114. In various embodiments, voltage reference 246 is further coupled to the proof-mass 110 and set to substantially one half of the reference voltage.

As discussed above, the frequency module 116 may receive one or more reference parameters, for example, a frequency reference waveform, at the frequency comparator 208. In one implementation, the frequency reference waveform has a reference frequency to which the oscillation frequency of the resonator should be compared. The frequency module 116 receives the oscillation signal from the output of the differential pick-off amplifier 134, converts the oscillation signal to a digital signal, determines the frequency of the oscillation signal based on the clock signal (e.g., as discussed above), and compares the oscillation frequency of the resonator 102 to the reference frequency. In one embodiment, the reference frequency is received from a reference oscillator. A force adjustment signal representing the control signal necessary to drive the difference between the oscillation frequency of the resonator 102 and the reference frequency to approximately 0, is output by the frequency module 116. In one implementation, the counter 204, controller 206, and frequency comparator 208 include digital components; however, in further implementations such components may be analog components.

The force adjustment signal output from the frequency module 116 is provided to the digital-to-analog converter 212. Based on the received force adjustment signal, the digital-to-analog converter 212 converts the received digital signal to an analog signal and generates, or adjusts, the reference voltage provided to the converter 104 such that the bias voltage, generated by the converter 104 based on the reference voltage, drives the oscillation of the resonator 102 toward the reference frequency. The reference voltage is provided to the converter 104 and the RHPVR output 108. As discussed above, in various embodiments the converter 104 drives the bias voltage between the reference voltage and a ground reference. In one example, the reference voltage provided by the control circuitry is automatically adjusted such that the time-average oscillation frequency of the proof-mass corresponds to the reference frequency. For example this may include the natural frequency of the resonator.

The amplitude module 118 may also receive one or more reference parameters. In one implementation, the amplitude module is configured to receive an amplitude reference to which the oscillation amplitude of the oscillation signal is compared to generate an amplitude adjustment signal. The amplitude module 118 receives the oscillation signal from the differential pick-off amplifier 134, converts the oscillation signal to a digital signal, measures the duty-cycle of the digital signal to determine the amplitude of oscillation (as discussed above), compares the amplitude of oscillation to the amplitude reference, and provides an amplitude adjustment signal (e.g., amplitude command) to the digital-to-analog converter 228 based on the difference between the amplitude of oscillation and the amplitude reference.

The amplitude adjustment signal is configured to operate the digital-to-analog converter 228 and amplifier 140 to adjust a differential delay between the bias voltages applied to the first forcer 112 and second forcer 114. For example, the amplifier 140 drives one of the first capacitor 224 up in value and the second capacitor 226 down in value to introduce a time constant between the bias voltage applied to the first forcer 112 and second forcer 114. By delaying the application of the bias voltage between the first forcer 112 and the second forcer 114, the transient forces (i.e., kicks) applied to the proof mass by each forcer in response to a polarity change of the bias voltage will also be separated by the desired delay. Further adjustment of the time constant, by the digital-to-analog converter 228 in response to the amplitude adjustment signal, will increase or decrease the amplitude of the force step and the magnitude of the "kick" applied from the first forcer 112 and second forcer 114.

In one implementation, the counter 218, controller 220, and amplitude comparator 222 include digital components; however, in further implementations each may include analog components. It is appreciated that oscillation amplitude control will enhance stability, since amplitude may affect the natural frequency of the resonator 102 based on duffing non-linearity associated with capacitances of the forcers 112 and 114 and associated mechanical supports (e.g., springs), and back-EMF generated at the differential pick-off amplifier 134. While described above as adjusting the oscillation amplitude by adjusting the differential delay between the bias voltages to the first forcer 112 and second forcer 114 via the first capacitor 224 and second capacitor 226, in other embodiments, the oscillation amplitude may be controlled by any suitable technique. One such approach is further discussed below with reference to FIG. 4.

In one embodiment, the polarity control module 120 coupled with the converter is configured to adjust the timing at which the polarity of the bias voltage is reversed. It is appreciated that by controlling the timing at which the polarity of the bias voltage is reversed, the polarity control module 120 manages the timing of the periodic transitions between bias voltage values. For example, in one implementation, the polarity control module 120 ensures that the first forcer 112 or second forcer 114 kicks the proof-mass 110 at the same point during a position cycle of the proof-mass 110, such as at a zero-crossing of proof-mass position. In various embodiments, the polarity control module 120 receives the oscillation signal and the clock signal. The polarity control includes control logic configured to instruct the converter 140 to flip the polarity of the bias voltage at the same position in each cycle of the oscillation signal with a resolution defined by the clock period.

As described above, and shown in FIGS. 1 and 2, various embodiments include a converter 104 coupled with the first and second forcer 112 and 114, a polarity control module 120, and the control circuitry 106, configured to receive a reference voltage and periodically reverse the polarity of a bias voltage, based on the reference voltage, applied to the first forcer 112 and the second forcer 114. FIGS. 2A-2B show the converter 104 as including a DC-AC converter. In particular, the converter 104 may include a one-bit digital-to-analog converter 240 including a pair of switches that rail between the reference voltage (PVR) and a ground reference. It is appreciated that, according to some embodiments, the ground to which the converter 104 is coupled may be a ground at a non-zero voltage level. By referencing the proof-mass 110 to nominally one half of the reference voltage, the gain (G1 above) will be set equal to unity. Accordingly, by stabilizing the peak-to-peak bias voltage applied to the first forcer 112 and second forcer 114, a stable RHPVR reference signal will be achieved at the output 108 of the RHPVR. It is appreciated that referencing the proof-mass 110 at nominally one half of the reference voltage permits a stable PVR voltage while alternating the polarity of the bias voltage applied to the forcers 112, 114. As denoted in FIGS. 2A-2B, the control circuitry may further include a voltage divider having resistors 242 and 244 coupled to the proof-mass 110 and configured to generate the voltage reference 246. Voltage reference 246 may be coupled to the proof-mass 110, first capacitor 224, and second capacitor 226. FIGS. 2A-2B show the voltage reference 246 set to substantially one half of the reference voltage.

According to one embodiment, the proof-mass 110 and supports (not shown) are made of silicon material; however, in other embodiments the proof-mass 110 and supports may be made of any appropriate material. According to one embodiment, the RHPVR 100 is attached to a glass (i.e., silicon dioxide) substrate. According to other embodiments, the RHPVR 100 may be attached to any other appropriate material (e.g., silicon). According to one embodiment, the RHPVR 100 and glass substrate combination is placed inside of a vacuum (e.g., in a ceramic case); however, in other embodiments, any other type of case may be used.

As discussed above, in one embodiment, the MEMS resonator 102 is a dual plate MEMS resonator including upper and lower plates about a proof-mass (i.e., first forcer 112 and second forcer 114); however, in other embodiments, the MEMS resonator 102 may be configured differently (e.g., with a single plate on one side of the proof-mass). Also as discussed above, the MEMS resonator 102 includes a first proof-mass 110; however, in other embodiments, a second proof-mass may be used. According to other embodiments, any other appropriate proof-mass and plate configuration/geometry may be utilized. As discussed above, the MEMS resonator 102 includes plates that are adjacent a side of a proof-mass 110; however, in other embodiments, plates may be located adjacent any other portion of a proof-mass (e.g., an edge of a proof-mass). As discussed above, the MEMS resonator 102 includes forcers that are drive plates; however, in other embodiments, any other appropriate type of forcers may be utilized.

As described above, the RHPVR 100 provides a stable PVR based on the mechanical properties of a MEMS resonator, which are inherently radiation-hard. In addition, the RHPVR 100 further eliminates the effects of trapped charge in an RHPVR, as well as any error potentials in series with forcer capacitances.

Figure 3A:
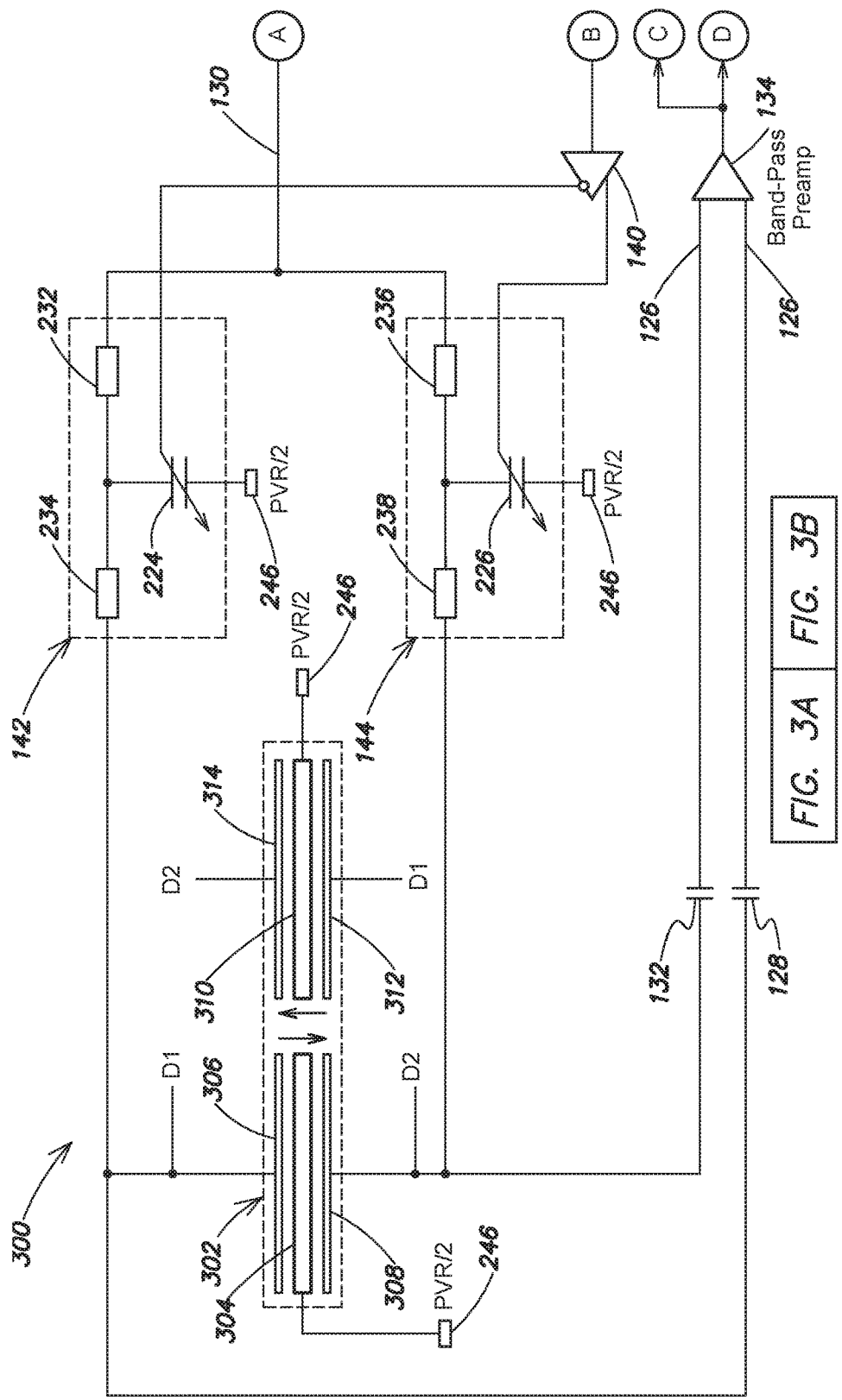
FIGS. 3A-3B is a block diagram of another example RHPVR according to aspects of the invention.
Figure 3B:
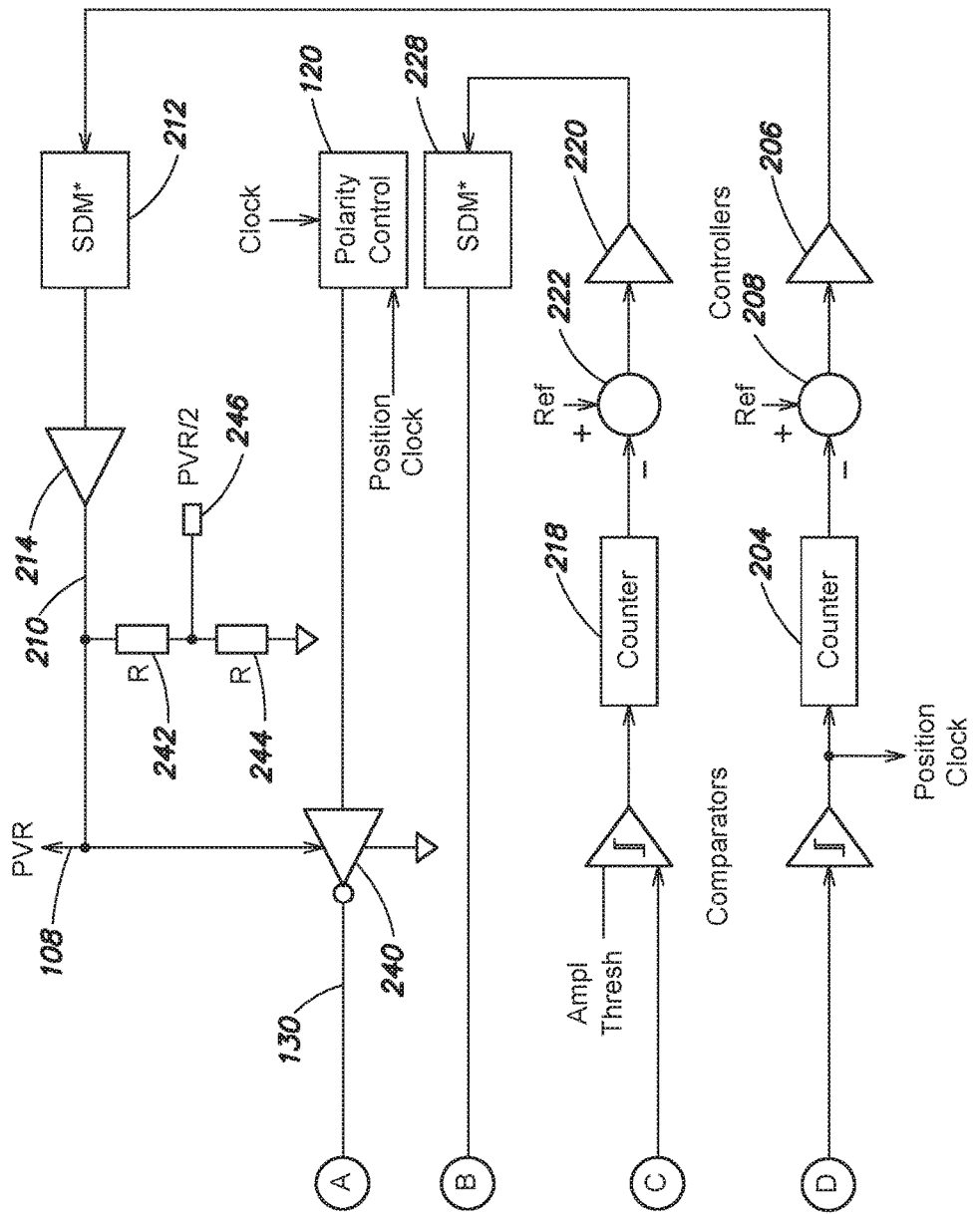

Turning now to FIGS. 3A-3B, and with continuing reference to FIG. 1, another example of a RHPVR 300 is shown. Embodiments discussed with reference to FIGS. 3A-3B, are substantially similar to those discussed above with reference to FIG. 1 with the exception of the resonator 302. In various embodiments, the resonator 302 of RHPVR 300 includes a tuning fork resonator including a first proof-mass 304, a second proof mass 310, a first forcer 306, a second forcer 308, a third forcer 312, and a fourth forcer 314. The first forcer 306 is located adjacent a first side of the first proof mass 304, and the second forcer 308 is located adjacent a second side of the first proof mass 304 that is opposite the first side. According to one embodiment, the first forcer 306 and second forcer 308 are symmetrical about the first proof mass 304 (i.e., a distance between the proof mass 304 and the first forcer 306 and a distance between the proof mass 304 and the second forcer 308 are substantially equal), as described above. Similarly, the third forcer 312 is located adjacent a first side of the second proof-mass 310, and the fourth forcer 314 is located adjacent a second side of the second proof-mass 310. The first forcer 306 and third forcer 312 are coupled to the input terminal 126 of the control circuitry 106 via the capacitor 128. The first forcer and third forcer 306 are also coupled to the output 130 of the converter 104. The second forcer 308 and fourth forcer 314 are coupled to the input terminal 126 of the control circuitry via the capacitor 132. The second forcer 308 and fourth forcer 314 are also coupled to the output 130 of the converter. As shown in FIGS. 3A-3B, the first forcer 306 and third forcer 312 may be coupled together (shown as D1), and the second forcer 308 and fourth forcer 314 may be coupled together (shown as D2).

As described above with reference to the first and second forcers 112, 114 of FIG. 1, the first forcer 306, second forcer 308, third forcer 312, and fourth forcer 314, receive a DC bias voltage from the converter 104 (e.g., one-bit digital to analog converter). The first proof-mass 304 and second proof-mass 310 are referenced to substantially one half of the reference voltage received by the converter 104 from the control circuitry 106. The converter 104 is configured to drive the bias voltage applied to the first, second, third, and fourth forcers 306, 308, 312, 314 between a ground reference and the reference voltage generated by the control circuitry 106. Accordingly, the polarity of the bias voltage may be periodically reversed, such that the time-average bias voltage applied to each is substantially zero. The periodic polarity reversal is performed by the converter 104 at a rate not exceeding a natural frequency of the resonator 302.

The bias voltage applied to each forcer generates an electrostatic force between the forcer and the respective proof mass. Transitions between the peak values of the bias voltage (i.e., the reference voltage and the ground reference) vary the electrostatic force between the forcers and excite the resonator 302 at an oscillation frequency. In various embodiments the resonator 302 is "kicked" as described above with reference to FIG. 1. By controlling the bias voltage applied to the forcer(s) such that the MEMS oscillation frequency matches that of an externally-supplied reference signal, a reference voltage utilized by a converter to generate the bias voltage may also be usable as a highly stable PVR, as the reference voltage (and corresponding bias voltage) must be maintained to drive the oscillation frequency of the MEMS resonator to match the external reference signal.

In one embodiment, the converter 104 applies a bias voltage to the first forcer 306, third forcer 312, second forcer 308, and fourth forcer 314, in the manner described above with reference to FIG. 1 and FIGS. 2A-2B. However, the forcers 306, 308, 312, and 314 are cross-coupled (as shown in FIGS. 3A-3B). Accordingly, the "kick" applied by the forcers is differential; that is, one forcer kicks in an upward direction while another forcer kicks in a downward direction. Such an implementation excites anti-parallel oscillations of the proof-masses 304, 310 (i.e., tuning fork mode).

Oscillations of the resonator 302 are electrically sensed by measuring the displacement of the first and second proof-mass 304 and 310. The differential pick-off amplifier 134 receives the electrically sensed oscillation signals of the first and second proof-mass 304 and 310. In one embodiment, the differential pick-off amplifier 134 produces a pick-off signal at its output which represents the difference between the oscillation signals of the first proof-mass 304 and the second-proof mass 310. The difference between the signals corresponds to the differential displacement between the two proof-masses when they are oscillating out-of-phase (i.e., in tuning fork mode). The pick-off signal may be fed to the frequency module 116, amplitude module 118 and polarity control module 120. In various embodiments the frequency module 116, amplitude module 118, and polarity control module 120, perform various functions as described above with reference to FIG. 1.

Figure 4:
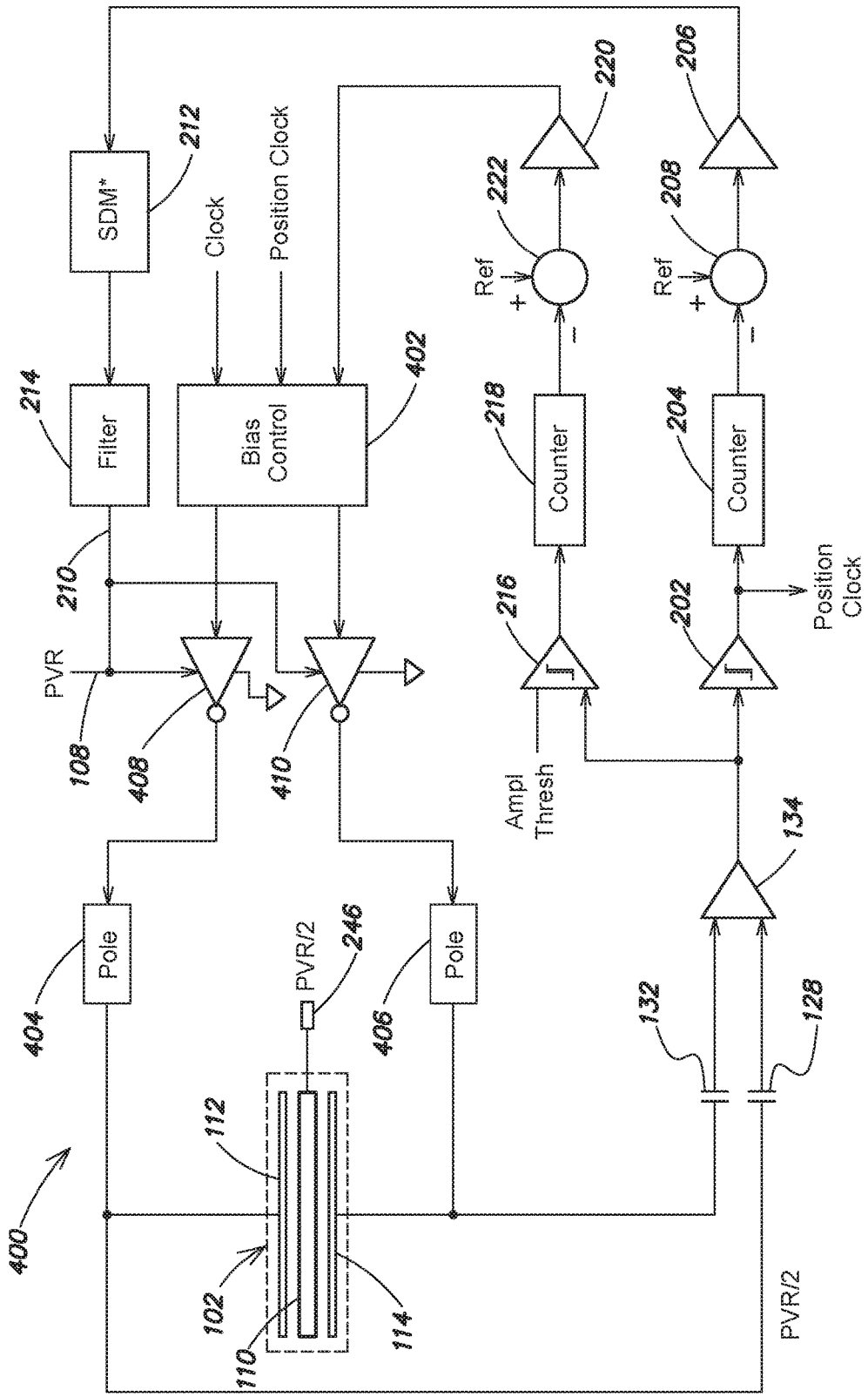
FIG. 4 is a block diagram of another example RHPVR according to aspects of the invention.

FIG. 4 shows another example arrangement of a RHPVR 400 according to various aspects and embodiments. In the shown example, the RHPVR 400 may include many of the same components as the example RHPVR 200 shown in FIGS. 2A-2B, namely, the resonator 102, the frequency module 116, the amplitude module 118, and the converter 104 (shown as a first converter 408 and a second converter 410), among subcomponents thereof. In the shown example, the RHPVR 400 may include a bias control circuit 402 coupled to an output of the amplitude module 118. Specifically, an input of the bias control circuit 402 may be coupled to an output of the amplitude module controller 220, and may be configured to receive the amplitude adjustment signal (e.g., amplitude command), the clock signal, and the position signal. An output of the bias control circuit 402 may be coupled with an input of a converter. In the shown example, the output of the bias control circuit 402 is coupled with an input of the first converter 408 and an input of the second converter 410.

In addition to the example arrangements shown in FIGS. 2A-2B and FIGS. 3A-3B, which may include one or more tunable capacitors (e.g., the first capacitor 224 and the second capacitor 226) to drive asymmetrical bias voltages to the first forcer 112 and the second forcer 114, certain examples, aspects, and embodiments discussed herein may include independent control circuitry for each forcer of the corresponding RHPVR. For example, the RHPVR 400 shown in FIG. 4 includes an independent bias control circuit to drive each forcer 112, 114 during operation. That is, instead of splitting and adjusting the same bias voltage between the first forcer 112 and the second forcer 114, the bias control circuit 402 may directly control a separate bias voltage applied to the first forcer 112 and the second forcer 114. Accordingly, in certain embodiments the bias control circuit 402 may directly control the timing of the bias voltage applied to each forcer 112, 114. In the example of FIG. 4, each converter 408, 410 is coupled to a corresponding electrode (e.g., pole 404, 406) of the associated forcer 112, 114.

Figure 5:
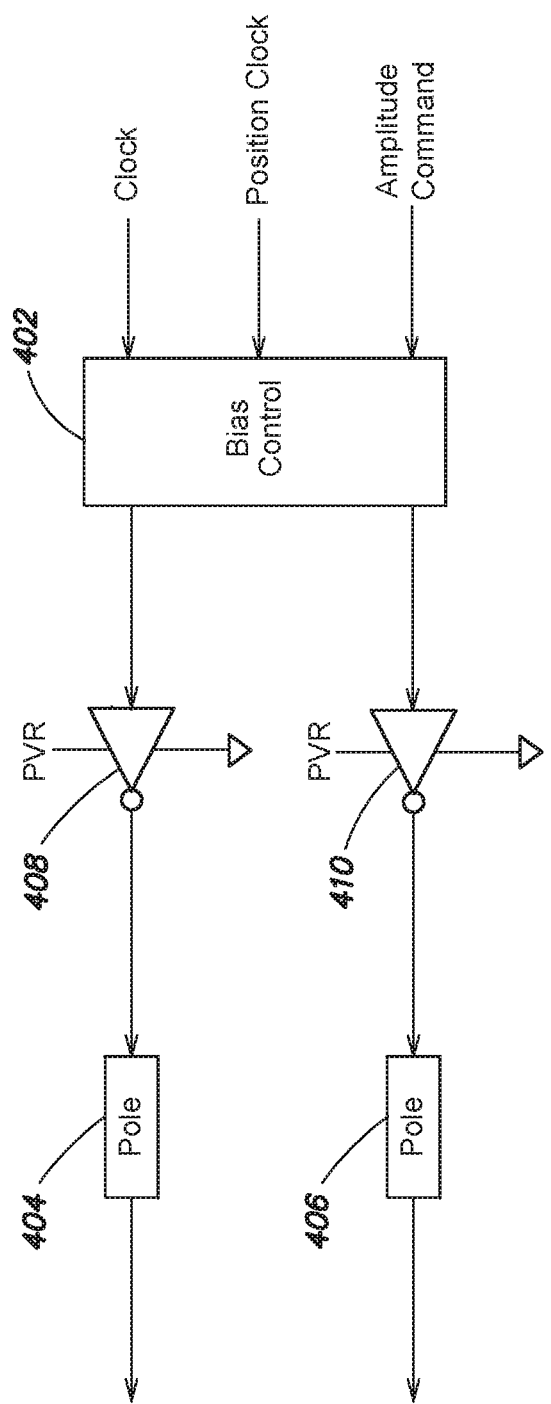
FIG. 5 is a further view of components of the example RHPVR shown in FIG. 4, according to aspects of the invention.

FIG. 5 shows a more detailed view of the bias control circuit 402, the first converter 408, and the second converter 410 of the example RHPVR 400 of FIG. 4. In particular, an output of the bias control circuit 402 may be coupled with the input of the first converter 408 along a first signal path, and the output of the bias control circuit 402 may be coupled with the input of the second converter 410 along a second signal path. Each of the first converter and second converter may be coupled with the corresponding electrode (e.g., pole 404, 406) of the associated forcer 112, 114. In the shown example, the first converter 408 is coupled to the first pole 404 of the first forcer 112, and the second converter 410 is coupled to the second pole 406 of the second forcer 114. Each converter 408, 410 may be further coupled to the output (i.e., the voltage reference (PVR)) and a ground, as discussed above with reference to the converter 240 shown in the example of FIGS. 2A-2B.

In the shown example of FIG. 5, each of the bias voltages (i.e., the bias voltage applied to the first forcer 112 and the bias voltage applied to the second forcer 114) has two stable states. The first stable state is the reference voltage (PVR) and the second stable state is the ground (about 0V). In certain embodiments the bias control circuit 402 switches each bias voltage between these states, with a differential delay between the switching of the first bias voltage and the switching of the second bias voltage. As discussed above with reference to at least FIGS. 2A-2B, these closely-spaced bias voltage transitions "kick" the proof-mass 110 causing the resonator 102 to oscillate at the desired frequency. Increasing the differential delay between the bias voltage transitions may increase the magnitude of the "kick" and hence increase the resonator 102 drive.

Figure 6:
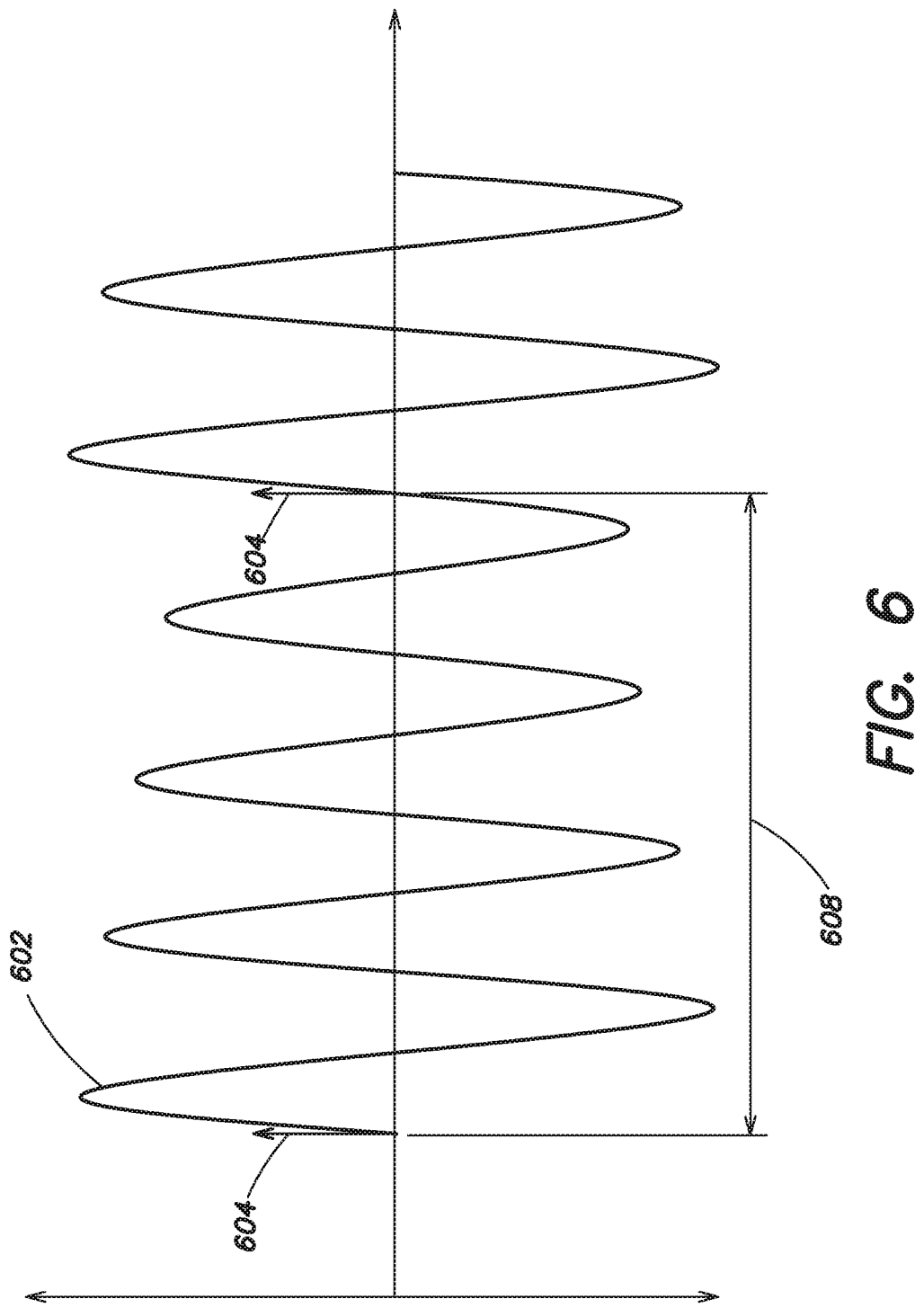
FIG. 6 is a graph illustrating resonator oscillations of the example RHPVR shown in FIG. 4, according to aspects of the invention.

FIG. 6 illustrates one example of resonator 102 oscillations during operation of the RHPVR 400 shown in FIG. 4. In the graphical illustration of FIG. 6, displacement of the proof mass 110 is illustrated by the trace 602. In the example illustration of FIG. 6, displacement is indicated by the vertical axis and time is represented by the horizontal axis. Further, each "kick" by a forcer, such as the first forcer 112 and the second forcer 114, is indicator by an arrow 604. As discussed above, each "kick" represents the transition of both bias voltages, with the differential delay therebetween determining the amplitude of the "kick." The period between each "kick" is represented by line 608, and may be chosen based on any suitable time period, such as 5 ms.

It is appreciated that various aspects and embodiments discussed above with reference to FIGS. 1-5 are directed to a MEMS based Precision Voltage Reference (PVR) which is radiation-hard. The MEMS based Radiation-Hard Precision Voltage Reference (RHPVR) can attain greatly improved radiation hardness compared to current state-of-the-art radiation-hard voltage references, which are typically based solely on radiation sensitive electrical components such as diodes and/or transistors. In particular, the RHPVR achieves high stability in nuclear radiation environments, such as stability approaching 1 ppm. Various embodiments of the RHPVR discussed herein periodically alter the polarity of an applied bias voltage, desensitizing the RHPVR to trapped charge and error potentials. Such aspects and embodiments permit highly-reliable thrust-axis accelerometers capable of supporting the stringent performance requirements of strategic guidance applications. Accordingly, various embodiments address the effects of radiation induced trapped charge and DC offset voltages, such as from unbalanced thermocouple voltages, which may directly impact the RHPVR.

Figure 7:
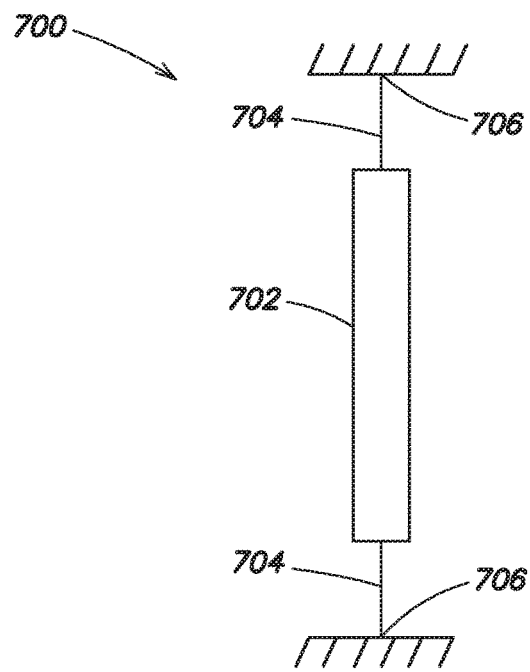
FIG. 7 is a block diagram of one example of a mass-spring system according to aspects of the invention.

Turning now to FIG. 7, shown is a mass-spring system 700. The mass-spring system 700 includes a proof-mass 702, tethers or flexures 704, and mechanical references 706. The mass-spring system based resonator 700 includes the proof-mass 702 tethered to the mechanical references 706 with tethers 704. The tethers 704 act like springs, and the movement of the mass 702 is constrained along the sense axis by the spring force, damping forces, inertial forces, and electrostatic forces.

Hooke's law is an approximation that the applied load (or force) needed to extend a spring is directly proportional to the amount of extension. A real spring requires more incremental force to produce a given incremental extension if its extension is greater to start with. The effect is mathematically expressed as cubic stiffening, called a "Duffing non-linearity". If the mass-spring system 700 is used in a MEMS resonator as discussed above, the non-linearity of the spring couples the mechanical oscillation amplitude to the natural frequency of the resonator. If a force is applied to the proof-mass 702, and if the force depends on (i.e., is proportional to) the proof-mass displacement, the force will have the effect of changing the effective spring stiffness. In the context of a self-oscillator, the force can then produce a change in the natural frequency of the mass-spring system.

Figure 8:
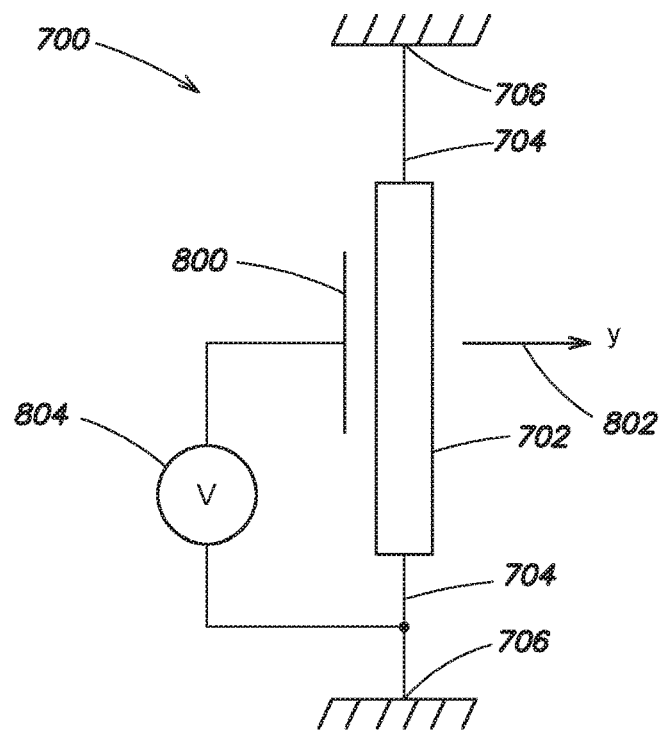
FIG. 8 is a block diagram of one example of a mass-spring system including a single forcer according to aspects of the invention.

FIG. 8 illustrates the mass-spring system 700 including an electrostatic (e.g., parallel-plate capacitive) forcer 800 that is coupled to a voltage source 804. Assuming that there is initially a voltage of zero volts applied to the forcer 800 by the voltage source 804 and the proof-mass 702 is displaced toward the forcer 800, the proof-mass 702 experiences a force in the positive y direction 802 applied by the flexures 704 (i.e., the spring). Assuming that a DC voltage is applied to the forcer 800 by the voltage source 804 and the proof-mass 702 is displaced toward the forcer 800, there is the same force (as when zero volts was applied to the forcer 800) applied in the positive y direction 802 by the flexures 704, but there is also an additional force applied in the negative y direction by the forcer 800. In both instances, the opposing forces increase in magnitude with the magnitude of the displacement. Thus, addition of the parallel-plate capacitive forcer 800 has the effect of "softening" the spring (i.e., reducing the spring stiffness). An increase in (mean-square) voltage applied to the forcer will increase this effect.

If the mass-spring system 700 is self-oscillating, the (mean-square) voltage applied to the forcer 800 by the voltage source 804 will modulate the natural frequency (and thus, the oscillation frequency) of the mass-spring system 700 (i.e., the resonator). The natural frequency is proportional to the square-root of the effective stiffness. Accordingly, the result is a mass-spring system 700 that is an electromechanical voltage controlled oscillator. By setting the oscillator frequency equal to a stable reference frequency, a precision voltage reference can be produced, as only a particular voltage applied to the forcer 800 will result in the oscillation frequency of the system matching the reference frequency.

While shown in FIG. 8 as including single forcer, in further embodiments, and as discussed herein, the proof-mass system may include a second forcer. It is appreciated that the addition of a second forcer will increase the negative stiffness at a given PVR voltage. This may allow for a decrease in sensitivity to frequency. Additionally, as discussed herein, addition of a symmetric forcer may reduce specific-force sensitivity.

Figure 9:
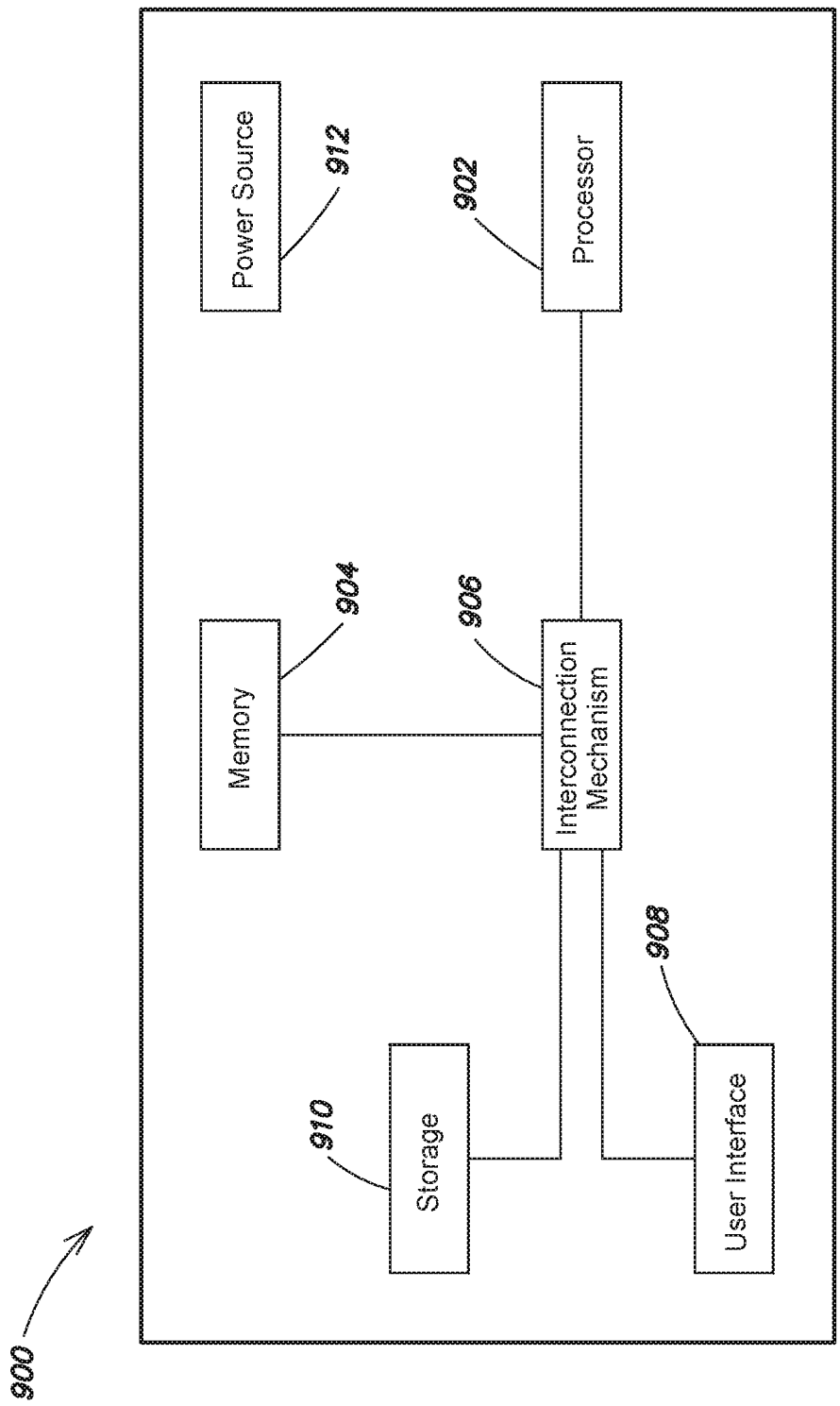
FIG. 9 is a block diagram of one example of a controller according to aspects of the invention.

As described above, one or more components of the control circuitry may be implemented digitally. Referring to FIG. 9, there is illustrated a block diagram of an example controller, in which various aspects and functions are practiced. As shown, the controller can include one or more systems components that exchange information. More specifically, the controller 900 can include at least one processor 902, a power source 912, a data storage 910, a user interface 908, a memory 904, and one or more interconnection mechanisms 906. The at least one processor 902 may be any type of processor or multiprocessor. The at least one processor 902 is connected to the other system components, including one or more memory devices 904 by the interconnection mechanism 906. In various embodiments, the controller 900 can further include any appropriate signal processing circuitry.

The memory 904 stores programs (e.g., sequences of instructions coded to be executable by the processor 902) and data during operation of the controller 900. Thus, the memory 904 may be a relatively high performance, volatile, random access memory such as a dynamic random access memory ("DRAM") or static memory ("SRAM"). However, the memory 904 may include any device for storing data, such as a disk drive or other nonvolatile storage device. Various examples may organize the memory 904 into particularized and, in some cases, unique structures to perform the functions disclosed herein. These data structures may be sized and organized to store values for particular data and types of data.

Components of the controller 900 are coupled by an interconnection mechanism such as the interconnection mechanism 906. The interconnection mechanism 906 may include any communication coupling between system components such as one or more physical busses in conformance with specialized or standard computing bus technologies such as IDE, SCSI, PCI and InfiniB and. The interconnection mechanism 906 enables communications, including instructions and data, to be exchanged between system components of the controller 900.

The controller 900 can also include one or more user interface devices 908 such as input devices, output devices and combination input/output devices. Interface devices may receive input or provide output. More particularly, output devices may render information for external presentation. Input devices may accept information from external sources. Examples of interface devices include keyboards, mouse devices, trackballs, microphones, touch screens, printing devices, display screens, speakers, network interface cards, etc. Interface devices allow the controller 900 to exchange information and to communicate with external entities, such as users and other systems.

The data storage element 910 includes a computer readable and writeable data storage medium configured to store non-transitory instructions and other data, and can include both nonvolatile storage media, such as optical or magnetic disk, ROM or flash memory, as well as volatile memory, such as RAM. The instructions may include executable programs or other code that can be executed by the at least one processor 902 to perform any of the functions described here below.

Although not illustrated in FIG. 9, the controller 900 may include additional components and/or interfaces, such as a communication network interface (wired and/or wireless), and the at least one processor 902 may include a power saving processor arrangement.

The RHPVR described herein provides a stable PVR based on the mechanical properties of a MEMS resonator, which are inherently radiation-hard. The MEMS based Radiation-Hard Precision Voltage Reference (RHPVR) can attain greatly improved radiation hardness compared to current state-of-the-art radiation-hard voltage references, which are based solely on electrical components such as diodes and/or transistors.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only.

What is claimed is:

1. A Precision Voltage Reference (PVR) comprising:
 a resonator having an oscillation frequency, the resonator including a first proof-mass, a first forcer located adjacent a first side of the first proof-mass, and a second forcer located adjacent a second side of the first proof-mass;
 control circuitry configured to generate a reference voltage based on the oscillation frequency of the resonator;
 at least one converter coupled to the control circuitry, the first forcer, and the second forcer, the at least one converter configured to receive the reference voltage from the control circuitry, provide a first bias voltage to the first forcer based on the reference voltage, provide a second bias voltage to the second forcer based on the reference voltage, and periodically alter a polarity of the first bias voltage and the second bias voltage to drive the oscillation frequency of the resonator to match a reference frequency, wherein in periodically altering the polarity of the first bias voltage and the second bias voltage, the at least one converter is configured to drive each of the first bias voltage and the second bias voltage between the reference voltage and a ground reference; and an output configured to provide the reference voltage as a voltage reference signal.

2. The PVR according to claim 1, further comprising a voltage reference coupled to the proof-mass and configured to reference the proof-mass to substantially one half of the reference voltage.

3. The PVR according to claim 1, wherein the control circuitry includes a frequency module coupled to the at least one converter, and the frequency module comprises:
a frequency detector configured to detect the oscillation frequency of the resonator;
a frequency comparator configured to compare a time-average of the oscillation frequency to the reference frequency; and
a frequency controller configured to generate a force adjustment signal based on the compared oscillation frequency and reference frequency to adjust the reference voltage generated by the control circuitry such that the oscillation frequency of the resonator matches the reference frequency.

4. The PVR according to claim 1, wherein the control circuitry includes an amplitude module coupled to the first forcer and the second forcer, wherein the amplitude module comprises:
an amplitude detector configured to detect an oscillation amplitude of resonator oscillations;
an amplitude comparator configured to compare the oscillation amplitude to an amplitude reference; and
an amplitude controller configured to generate an amplitude adjustment signal based on the compared oscillation amplitude and amplitude reference.

5. The PVR according to claim 4, further comprising:
a first tunable capacitor coupled to the first forcer;
a second tunable capacitor coupled to the second forcer; and
an amplifier coupled to the first tunable capacitor, the second tunable capacitor, and the amplitude module, wherein the amplitude adjustment signal controls the amplifier to adjust a differential delay between the first bias voltage provided to the first forcer and the second bias voltage provided to the second forcer.

6. The PVR according to claim 4, further comprising a bias control circuit coupled to the amplitude module,
wherein the at least one converter includes a first converter coupled to the bias control circuit and the first forcer, and configured to provide the first bias voltage to the first forcer,
wherein the at least one converter includes a second converter coupled to the bias control circuit and the second forcer, and configured to provide the second bias voltage to the second forcer, and
wherein the amplitude adjustment signal controls the bias control circuit to adjust a differential delay between the first bias voltage provided to the first forcer and the second bias voltage provided to the second forcer.

7. The PVR according to claim 1, wherein the at least one converter includes a one-bit digital-analog converter.

8. The PVR according to claim 1, wherein the resonator further includes:
a second proof-mass;
a third forcer located adjacent a first side of the second proof-mass; and
a fourth forcer located adjacent a second side of the second proof-mass, wherein, the at least one converter is configured to apply at least one of the first bias voltage and the second bias voltage to at least one of the third forcer and the fourth forcer.

9. A Precision Voltage Reference (PVR) comprising:
a resonator having an oscillation frequency, the resonator including a first proof-mass, a first forcer located adjacent a first side of the first proof-mass, and a second forcer located adjacent a second side of the first proof-mass;
control circuitry configured to generate a reference voltage based on the oscillation frequency of the resonator;
conversion means coupled to the first forcer and the second forcer and configured to receive the reference voltage from the control circuitry, provide a first bias voltage to the first forcer based on the reference voltage, provide a second bias voltage to the second forcer based on the reference voltage, and periodically alter a polarity of the first bias voltage and the second bias voltage such that the oscillation frequency of the resonator matches a reference frequency, wherein in periodically altering the polarity of the first bias voltage and the second bias voltage, the conversion means is configured to drive each of the first bias voltage and the second bias voltage between the reference voltage and a ground reference; and
an output configured to provide the reference voltage as a voltage reference signal.

10. A method for generating a precision voltage reference with a resonator having an oscillation frequency, the resonator including a first proof-mass, a first forcer located adjacent a first side of the first proof-mass, and a second forcer located adjacent a second side of the first proof-mass, the method comprising:
generating a reference voltage based on the oscillation frequency of the resonator;
receiving the reference voltage with at least one converter coupled to the first forcer and the second forcer;
providing, with the at least one converter, a first bias voltage based on the reference voltage to the first forcer;
providing, with the at least one converter, a second bias voltage based on the reference voltage to the second forcer;
periodically altering a polarity of the first bias voltage applied to the first forcer and the second bias voltage applied to second forcer such that the oscillation frequency of the resonator matches a reference frequency, wherein periodically altering the polarity of the first bias voltage and the second bias voltage includes driving each of the first bias voltage and the second bias voltage between the reference voltage and a ground reference; and
providing the reference voltage as a voltage reference signal.

11. The method according to claim 10, further comprising referencing the first proof-mass to substantially one half of the reference voltage.

12. The method according to claim 10, further comprising:
detecting the oscillation frequency of the resonator;
comparing a time-average of the oscillation frequency of the resonator to the reference frequency; and
generating a force adjustment signal responsive to comparing the oscillation frequency of the resonator and the reference frequency, and adjusting, based on the force adjustment signal, the reference voltage such that the oscillation frequency of the resonator matches the reference frequency.

13. The method according to claim 10, further comprising:
    detecting an oscillation amplitude of resonator oscillations;
    comparing the oscillation amplitude to an amplitude reference; and
    generating an amplitude adjustment signal responsive to comparing the oscillation amplitude and the amplitude reference.

14. The method according to claim 13, further comprising:
    providing the amplitude adjustment signal to an amplifier, the amplifier coupled to a first tunable capacitor and a second tunable capacitor; and
    controlling the first tunable capacitor and the second tunable capacitor based on the amplitude adjustment signal to adjust a differential delay between the first bias voltage applied to the first forcer and the second bias voltage applied to the second forcer.

15. The method according to claim 13, wherein the at least one converter includes a first converter coupled to the first forcer and configured to provide the first bias voltage, and a second converter coupled to the second forcer and configured to provide the second bias voltage, and wherein the method further comprises:
    providing the amplitude adjustment signal to a bias control circuit; and
    controlling the bias control circuit based on the amplitude adjustment signal to adjust a differential delay between the first bias voltage applied to the first forcer and the second bias voltage applied to the second forcer.

16. The method according to claim 10, wherein the resonator includes a second proof-mass, a third forcer located adjacent a first side of the second proof-mass, and a fourth forcer located adjacent a second side of the second proof-mass, and the method further comprising:
    applying at least one of the first bias voltage and the second bias voltage to at least one of the third forcer and the fourth forcer.

* * * * *